(12) United States Patent
Moon

(10) Patent No.: US 6,566,275 B1
(45) Date of Patent: May 20, 2003

(54) SPINNER APPARATUS WITH CHEMICAL SUPPLY NOZZLE AND METHODS OF FORMING PATTERNS AND PERFORMING ETCHING USING THE SAME

(75) Inventor: Seong-yong Moon, Suwon (KR)

(73) Assignee: Samsung Electronics Co., Ltd. (KR)

( * ) Notice: Subject to any disclaimer, the term of this patent is extended or adjusted under 35 U.S.C. 154(b) by 96 days.

(21) Appl. No.: 09/702,523

(22) Filed: Oct. 31, 2000

(30) Foreign Application Priority Data

Nov. 15, 1999 (KR) ............................. 99-50599

(51) Int. Cl.$^7$ ............................. H01L 21/302
(52) U.S. Cl. ............... 438/745; 438/746; 438/747
(58) Field of Search ................. 438/708, 714, 438/715, 725, 745, 746, 747; 156/345.17, 345.21; 239/128

(56) References Cited

U.S. PATENT DOCUMENTS

| | | | |
|---|---|---|---|
| 5,878,964 A | 3/1999 | Hansen | 239/556 |
| 5,884,847 A | 3/1999 | Christopher | 239/390 |
| 6,107,009 A * | 8/2000 | Tan | 430/331 |
| 6,235,440 B1 * | 5/2001 | Tao et al. | 430/30 |
| 6,391,111 B1 * | 5/2002 | Fujimoto et al. | 118/320 |

FOREIGN PATENT DOCUMENTS

| | | | |
|---|---|---|---|
| JP | 61102034 A * | 5/1986 | H01L/21/30 |
| JP | 7283104 | 10/1995 | H01L/21/027 |
| JP | 11111673 | 4/1999 | H01L/21/306 |

OTHER PUBLICATIONS

Z. Y. Guo et al., "Resist contrast requirement for sub–0.25um lithography," SPIE vol. 2437, pp. 86–93, 1995.

Hidetaka Saitoh et al., "Study of development methods for chemical amplification resist," SPIE vol. 3412, pp. 269–278, 1998.

Maiying Lu et al., "A 180 nm mask fabrication process using ZEP 7000, multipass gray, GHOST, and dry etch for MEBES 5000," SPIE vol. 3546, p. 98, 1998.

* cited by examiner

*Primary Examiner*—Robert Kunemund
*Assistant Examiner*—Binh X. Tran
(74) *Attorney, Agent, or Firm*—Mills & Onello LLP

(57) ABSTRACT

A spinner apparatus for manufacturing a photomask, performing a developing process for forming a resist pattern on a specific substrate, and performing an etching process in which a resist pattern is used as an etching mask are provided. A plurality of supply nozzles for supplying a developing solution or an etching solution are provided above the substrate on which processes will be performed and processing conditions such as the temperature and flux of the chemicals supplied from each supply nozzle are independently controlled. Accordingly, it is possible to control the deviation of the critical dimensions of the device.

8 Claims, 9 Drawing Sheets

100RPM=28nm
20nm

400=34nm
25nm

1000=42nm
30nm

C20.2°C/20.6°C

C21°C/21°C

SPINNER APPARATUS WITH CHEMICAL SUPPLY NOZZLE AND METHODS OF FORMING PATTERNS AND PERFORMING ETCHING USING THE SAME

BACKGROUND OF THE INVENTION

1. Field of the Invention

The present invention relates to a spinner apparatus with chemical supply nozzles and methods of forming patterns and performing etching using the same.

2. Description of the Related Art

In general, during processes for manufacturing semiconductor devices, electronic circuits are realized by performing certain functions by manipulating and controlling the order in which conductive layers, semiconductor layers, and insulating layers are stacked in combination with the shapes of patterns. In particular, in a semiconductor memory device and a semiconductor logic device, a plurality of unit chips having the same function and shape are repeatedly realized on the semiconductor wafer using a photomask designed for a certain purpose. Also, in the associated unit chips, a plurality of unit cells having the same shape are repeatedly formed in the unit chips in the form of a matrix.

As the semiconductor memory device and the semiconductor logic device become more highly integrated, the sizes of various patterns which constitute each device become even smaller. Accordingly, design rules are reduced to 0.35 $\mu$m, 0.25 $\mu$m, 0.18 $\mu$m, and 0.15 $\mu$m. However, contrary to the tendency of device patterns becoming smaller, the sizes of the semiconductor wafers are increasing to 6", 8", and 12" to improve productivity. Correspondingly, sizes of photomasks are increasing to sizes such as 5"×5", 6"×6", and 9"×9".

Therefore, in spite of the sizes of the device patterns being smaller, the sizes of substrates such as the semiconductor wafers or the photomasks are increasing. Accordingly, it is more difficult and important to form and manage the critical dimensions of the device patterns which are identically and repeatedly formed in the enlarged semiconductor wafer or photomask to be uniform all over the substrate. In particular, in the case of the photomask, it is more important to manage the uniformity of the critical dimension since the photomask operates as a disc for transcribing the image of the pattern formed on the photomask into the wafer.

FIG. 1 schematically shows the position of a spray-type nozzle 12, 14 on the photomask 10 in a conventional photomask apparatus, in which steps of a developing process for forming the pattern on a photomask 10 are shown. Referring to FIG. 1, the photomask 10 is divided into a binary mask for controlling the intensity of light and a phase shift mask for simultaneously controlling the phase and intensity of light. Hereinafter, the binary mask will be described.

A schematic square blank substrate, in which a light shielding film 10b is formed on a substrate 10a, is provided. High purity synthetic quartz glass having characteristics of high light transmissivity and low thermal expansion is generally used as the substrate 10a. A multi-layer structure of metal chrome and chrome compound is generally used as the light shielding film 10b.

The light shielding film 10b is coated with a resist layer 10c. In a positive-type E-beam resist, an electron beam decomposition type resist in which an organic solvent is used as a developing solution is mainly used as the resist layer 10c. In a negative-type E-beam resist, a chemical amplified resist (CAR) is used as the resist layer 10c.

An exposing process is performed on the resist layer 10c using an exposure apparatus according to the designed pattern. A raster scan type apparatus and a vector scan apparatus in which a spot beam is used are commonly used as the exposure apparatus. An exposing apparatus using a multi-beam is typically used. In FIG. 1, reference numeral 10c' denotes the exposure region of the resist layer which is exposed to light and creates a chemical reaction.

A designed resist pattern is formed by developing and removing the exposure region 10c' of the resist layer using the developing solution. Then, an etching process is performed on the light shielding film 10b using the resist pattern as the etching mask and a remaining resist pattern material is removed. Accordingly, a predetermined light shielding film pattern is formed on the substrate 10a. Therefore, a desired photomask is manufactured.

In the processes of manufacturing the photomask, the exposing process and the developing process are most important in determining the CD uniformity of the mask. In the exposing process, the uniformity of the CD is dependent on the reproducibility of pparatuses when a writing method, a substrate, and an accelerating voltage are determined in the exposing apparatus. Meanwhile, in the developing process, the uniformity of the CD can vary according to a developing apparatus and a developing method.

FIG. 1 shows one conventional process of manufacturing the photomask. In the developing process, the developing solution is supplied to the photomask 10 on which the exposing process is performed, thus developing the exposure region 10c'. The developed exposure region 10c' is then removed. The developing solution is sprayed by a first spray-type nozzle 12 and a second spray-type nozzle 14. At this time, the photomask 10 is fixed horizontally to the fixing chuck (not shown) of a rotating spinner and rotates at a certain speed. FIG. 2 is a plan view of FIG. 1, which shows the positions of the first spray-type nozzle 12 and the second spray-type nozzle 14 which are positioned on the photomask 10.

According to the conventional spin spray developing process, the resist pattern formed on the square photomask 10 rapidly changes in a concentric circle direction from the rotation center of the spinner. This is because various processing conditions in the rotation center do not coincide with those in the rotation edge since the photomask rotates in a state of being fixed to the fixing chuck of the spinner and the developing process is performed using fluid chemicals. Therefore, research on methods for improving the uniformity of the CD by maintaining the processing conditions all over the substrate such as the photomask and the wafer have been continuously required.

Results of comparing various methods of the developing process which greatly affect the uniformity of the CD are disclosed in "Study of Development Methods For Chemical Amplification Resist" Hidetaka Saito, et al, SPIE Vol. 3412, pp. 269–278, 1998. According to this article, when the deviation of the CD is measured after performing the developing process by a conventional shower-spray development method, a puddle development method, and a dip development method, the deviation of the CD (3$\delta$) is 17 nm, in the case of the dip development method. However, in the case of the dip development method, the developing solution must be renewed at all times in order to maintain a low level of defects in the mask. Accordingly, a large amount of developing solution is necessary, which is not economical.

Therefore, a soft-shower development method in which the spray pressure of the developing solution is changed is disclosed the above article. However, problems of the developing process of the conventional spin-spray method are not completely solved since processing conditions in the center of the substrate, i.e., the center of the rotation, are different from those at the edge of the substrate, which is significantly affected by the centrifugal force caused by the rotation.

SUMMARY OF THE INVENTION

To solve the above problem, it is an object of the present invention to provide a spinner apparatus with chemical supply nozzles capable of improving the critical dimension uniformity of a pattern formed on a substrate during a developing process or an etching process, which is performed by a spin method using chemicals.

It is another object of the present invention to provide a method for forming a pattern, capable of improving the critical dimension uniformity of the pattern formed on the substrate during the developing process performed by the spin method using chemicals.

It is another object of the present invention to provide an etching method capable of improving the critical dimension uniformity of an underlayer pattern etched using the pattern which was previously formed on a specific underlayer on the substrate as an etching mask, during an etching process performed by the spin method using chemicals.

The above objects are achieved by providing a plurality of supply nozzles for supplying a developing solution or an etching solution and independently controlling processing conditions such as the temperature of chemicals supplied from the plurality of supply nozzles when manufacturing a photomask, developing a resist pattern on a specific substrate, or etching using the resist pattern as an etching mask.

In accordance with one aspect of the invention, there is provided a spinner apparatus including a rotating member or platform to which a substrate is fix horizontally. A plurality of chemical supply nozzles separated from each other by a predetermined distance are provided for vertically and downwardly supplying process performing chemicals to the substrate. A chemical supply source stores the chemicals supplied to the chemical supply nozzles, and a plurality of chemical supply pipes are provided between the chemical supply source and the chemical supply nozzles.

In one embodiment, the temperature of the chemicals supplied to the substrate through the chemical supply nozzles is independently controlled in each supply nozzle. In addition, the flux of the chemicals supplied to the substrate through the chemical supply nozzles is independently controlled in each supply nozzle. Also, the chemical supply nozzles can be stream-type nozzles which vertically and downwardly flow the chemicals. The chemical supply nozzles can vertically and horizontally move with respect to the substrate.

The process performing substrate can be a photomask, a semiconductor wafer, a liquid crystal display (LCD) substrate, or a flat panel display (FPD) substrate. The spinner apparatus can be a developing apparatus or an etching apparatus.

In accordance with another aspect of the invention, there is provided a method for forming a pattern. An etched material layer to be etched and a pattern forming material layer are sequentially formed on a substrate. An exposing process is performed to define a pattern on the pattern forming material layer. The substrate is loaded on a rotating member or platform in a processing chamber in which a processing temperature is controlled. A plurality of supply nozzles are provided at a plurality of positions above the substrate, each of the supply nozzles providing a developing solution, the temperature of which is independently controlled. At least part of the pattern forming material layer on which the exposing process is performed is developed and removed by rotating the substrate and vertically and downwardly flowing the developing solution from the plurality of supply nozzles above the substrate.

In order to optimize processing conditions, a critical dimension (CD) can be measured in each position on the substrate with respect to the pattern formed by removing part of the pattern forming material layer, and the temperature of the developing solution supplied from each position above the substrate can be controlled on the basis of the measured CDs of each position.

In accordance with another aspect of the invention, there is provided a method for performing etching. An etching mask layer is formed having a specific pattern on a substrate on which an etched material layer is formed. The substrate on which the etching mask layer is formed is loaded on a rotating member or platform in a processing chamber in which a processing temperature is controlled. At least part of the etched material layer is etched and removed by rotating the substrate and vertically and downwardly flowing an etching solution from a plurality of supply nozzles above the substrate, the temperature of the etching solution from each nozzle being independently controlled.

In order to optimize processing conditions, a critical dimension (CD) in each position on the substrate can be measured with respect to the pattern of the etched material layer, and the temperature of the etching solution supplied from above the substrate to each position can be controlled on the basis of the measured CD.

According to the present invention, the deviation of the CD is very small all over the mask or the substrate since the temperatures and fluxes of the chemicals, which are supplied from a plurality of chemical supply nozzles which are separated from each other on the photomask or the substrate, are independently controlled. According to the present invention, the deviation of the CD all over the substrate is reduced by independently managing the plurality of chemical supply nozzles.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Factors causing CD errors in manufacturing a photomask include problems in an exposing process, problems in a developing process, and problems in an etching process. The factors causing CD errors in the exposing process are divided into hardware problems such as low contrast due to a low accelerating voltage, back scattering, a proximity effect, and multiple scattering and software problems such as E-beam resist of low sensitivity, a blank mask error, and influences of circumstances in a line. In particular, when a low accelerating voltage is used, the energy absorption profile is poor since the exposure contrast is quite wide. When the E-beam resist of low contrast is used, a developing margin is very narrow and the side wall slope of the resist is much poorer than that of photoresist.

During the developing process, the factors causing CD errors are mainly developing systems and methods. In particular, the speed at which the E-beam resist reacts with the developing solution is the main factor in determining the change of the side wall slope of the resist pattern. In the following chemical reaction speed equation, A, $E_0$, k, and T denote a reaction speed constant, an activation energy, the Baltzmann constant, and temperature, respectively.

$$R = A \exp(-E_0/kT) \quad (1)$$

Since the reaction speed constant, the activation energy, and the Boltzmann constant are constants, the reaction speed R of the resist is determined by temperature.

The reason why the temperature must be considered in the developing process of the E-beam resist is related to the component of the developing solution. Since water having much latent heat comprises about 97 wt % in the generally used developing solution of the photoresist, for example, tetramethyl ammonium hidro-oxide (TMAH), TMAH is not sensitive to temperature. However, since the developing solution of the E-beam resist, for example, an organic solvent is used in ZEP® where the compositions of diethylketone (DEK) and diethylmalonate (DEM) are in ratio of 50:50, the change in temperature due to vaporization heat is very severe.

In the developing process, not only is the temperature an important factor in controlling the CD, but so are the supply fluxes and the supply positions of the chemicals and the rotation speed of the spinner.

During the etching process where the resist pattern formed in the developing process is used as the etching mask, the CD is greatly affected by the profile of the resist pattern. When the process proceeds on the rotating spinner, deviation of the CD is caused by the differences between the processing conditions of the rotation center and the processing conditions at the edge, like in the developing process.

The present invention is mainly related to the developing process and the etching process, which are affected by the processing systems and the processing performing methods among the various factors which can cause CD errors.

Figure 1:
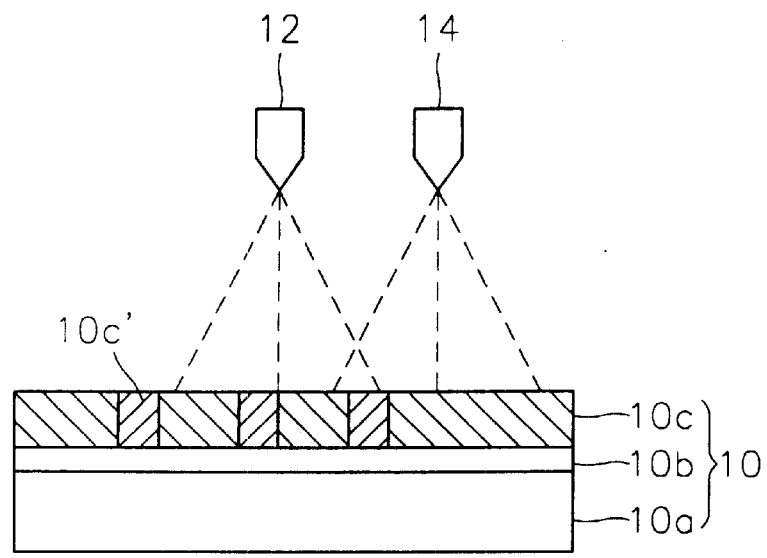
FIG. 1 schematically shows the positions of spray-type nozzles above a photomask in a conventional photomask apparatus.
Figure 2:
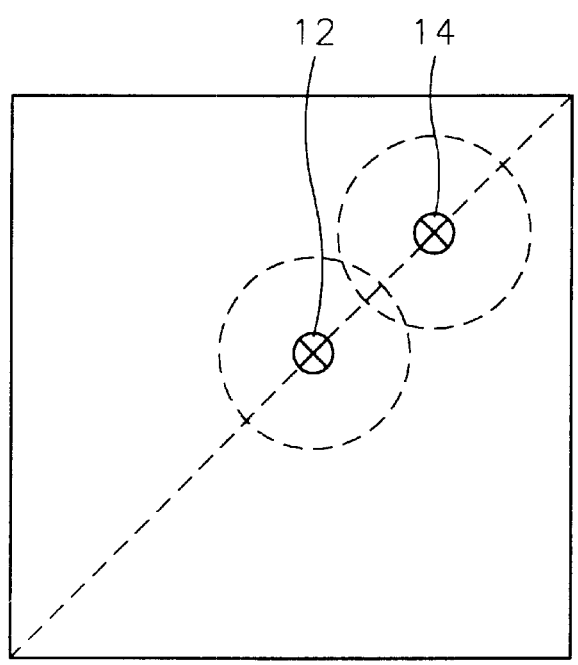
FIG. 2 is a plan view showing the positions of the nozzles above the photomask of FIG. 1.
Figure 3:
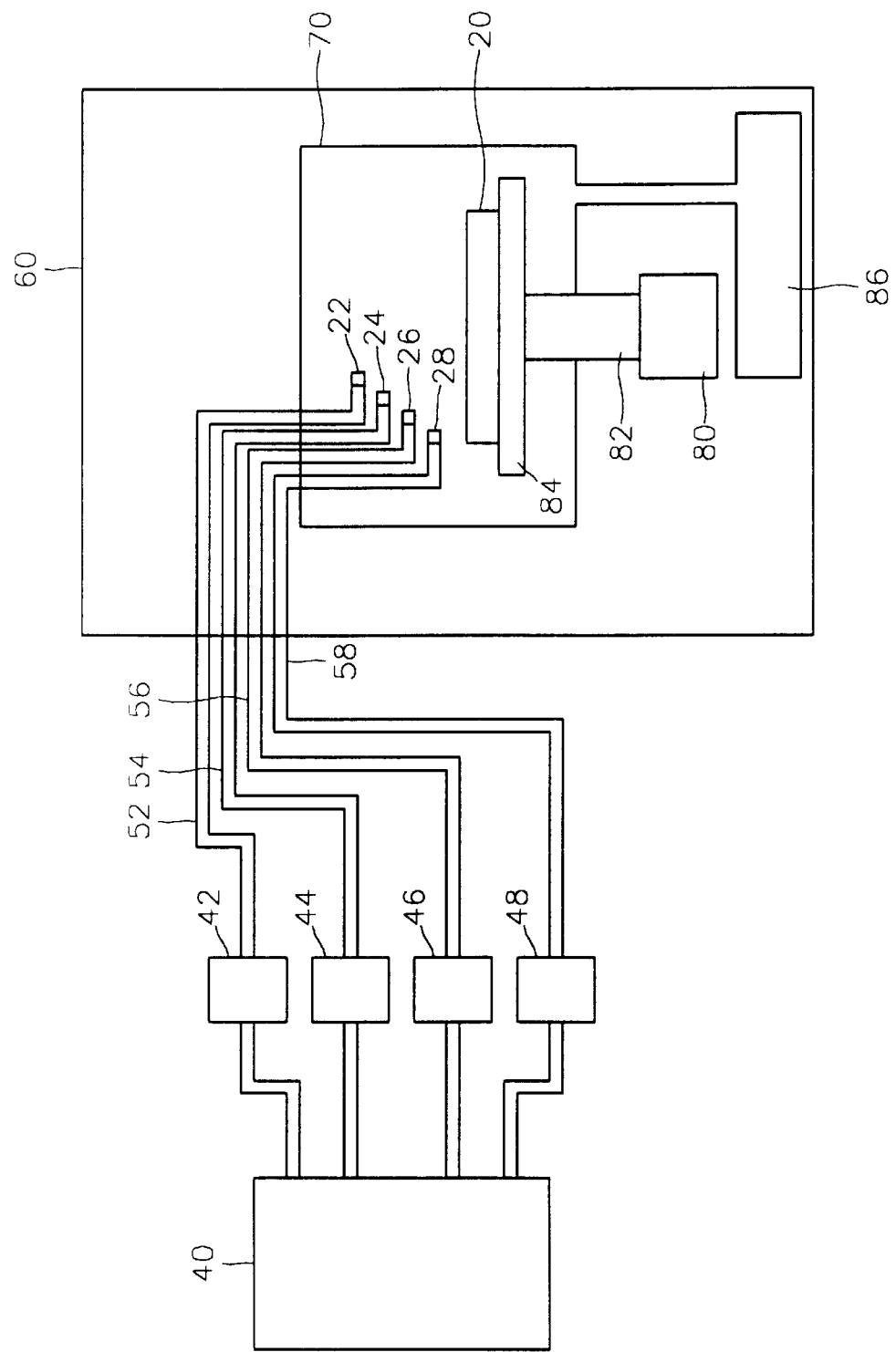
FIG. 3 schematically shows a photomask apparatus according to an embodiment of the present invention.

FIG. 3 schematically shows a photomask apparatus according to an embodiment of the present invention, which is the spinner apparatus which can perform the developing process. Referring to FIG. 3, the developing process is performed in a processing chamber 60 whose temperature is controlled to be uniform. A photomask 20 on which the developing process will be performed is horizontally fixed on a fixed chuck 84 positioned in a releasable process performing unit 70 by a clamp (not shown). The fixed chuck 84 uniformly rotates by a rotation shaft 82 which rotates by a motor 80. The exposing process was previously performed on the photomask 20 by the exposing apparatuses installed to be independent or adjacent to each other, as shown in FIG. 1.

Four chemical supply nozzles 22, 24, 26, and 28 are positioned above the photomask 20 in the processing performing unit 70. The developing solution stored in a chemical supply source 40 is independently supplied to the chemical supply nozzles through chemical supply pipes 52, 54, 56, and 58, respectively. Temperature controllers 42, 44, 46, and 48, for example, thermostats, are formed in the middle of the chemical supply pipes 52, 54, 56, and 58. The thermostats maintain the temperature of the chemicals supplied through the chemical supply pipes. Part of the chemical supply pipe is inserted into a small tank which can contain the chemicals. Accordingly, it is possible to supply the chemicals due to virtual pressure from the upper surface of the chemicals. The chemical supply pipe is a double pipe including a chemical pipe through which chemicals flow and a water pipe which surrounds the chemical pipe and through which water circulates. The temperature of the chemicals can be controlled by controlling the temperature of water which flows through the water pipe and contacts the chemical pipe. In the present embodiment, precise chemicals whose temperature can be controlled to increments of at least 0.01° C. is used.

The flux of the chemicals can be controlled by the virtual pressure from the upper surface of the chemicals stored in the small tank of the thermostat, by the pressure of a pump for supplying chemical, or by installing a valve in the chemical supply pipe.

Curved rotating units (not shown) are included in the plurality of supply nozzles 22, 24, 26, and 28 positioned above the photomask 20 in the process performing unit 70 so that parts of the chemical supply pipes 52, 54, 56, and 58 can rotate horizontally. When the developing process proceeds, the supply nozzles 22, 24, 26, and 28 are positioned in the process performing position above the photomask 20. Before or after the developing process proceeds, the supply nozzles 22, 24, 26, and 28 are positioned at the stand-by position outside the fixed chuck 84. The chemicals on which the process was performed are collected in a drain 86 positioned under the process performing unit 70.

Instead of the conventional spray-type supply nozzle shown in FIG. 1, stream or straight-type supply nozzles from which the chemicals vertically and downwardly flow are used as the chemical supply nozzles 22, 24, 26, and 28. Chemical supply nozzles having variable incident angles with respect to the process performing substrate can be used.

Figure 4:
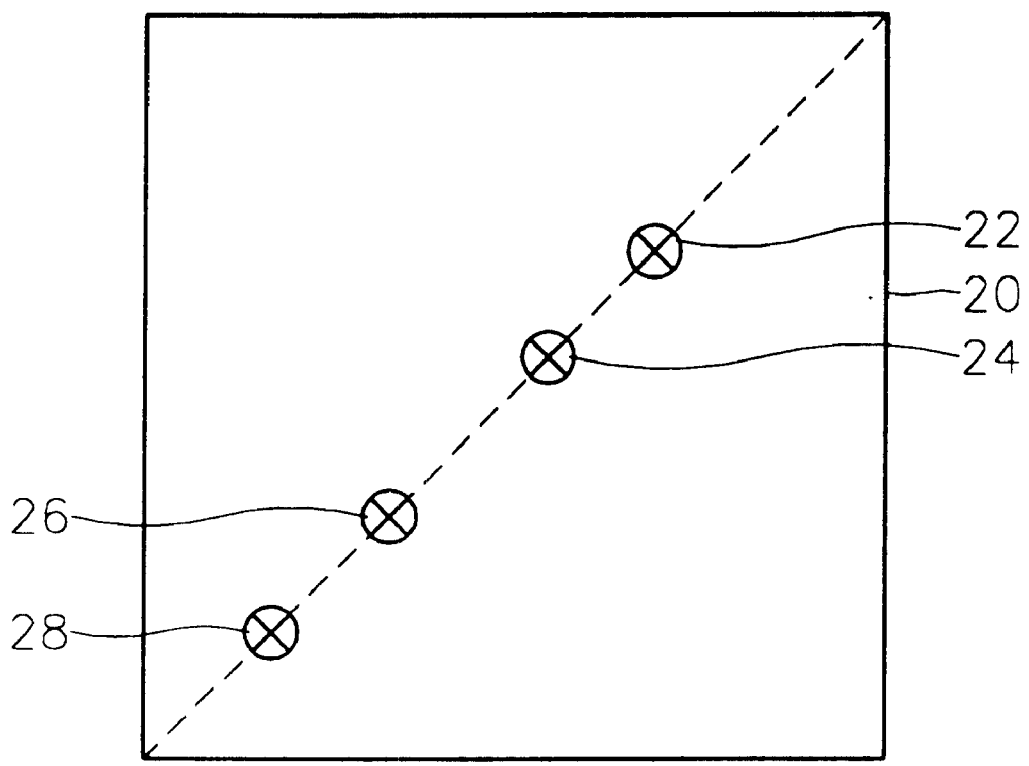
FIG. 4 is a plan view showing the positions of the nozzles above the photomask in the photomask apparatus according to an embodiment of the present invention.
Figure 5:
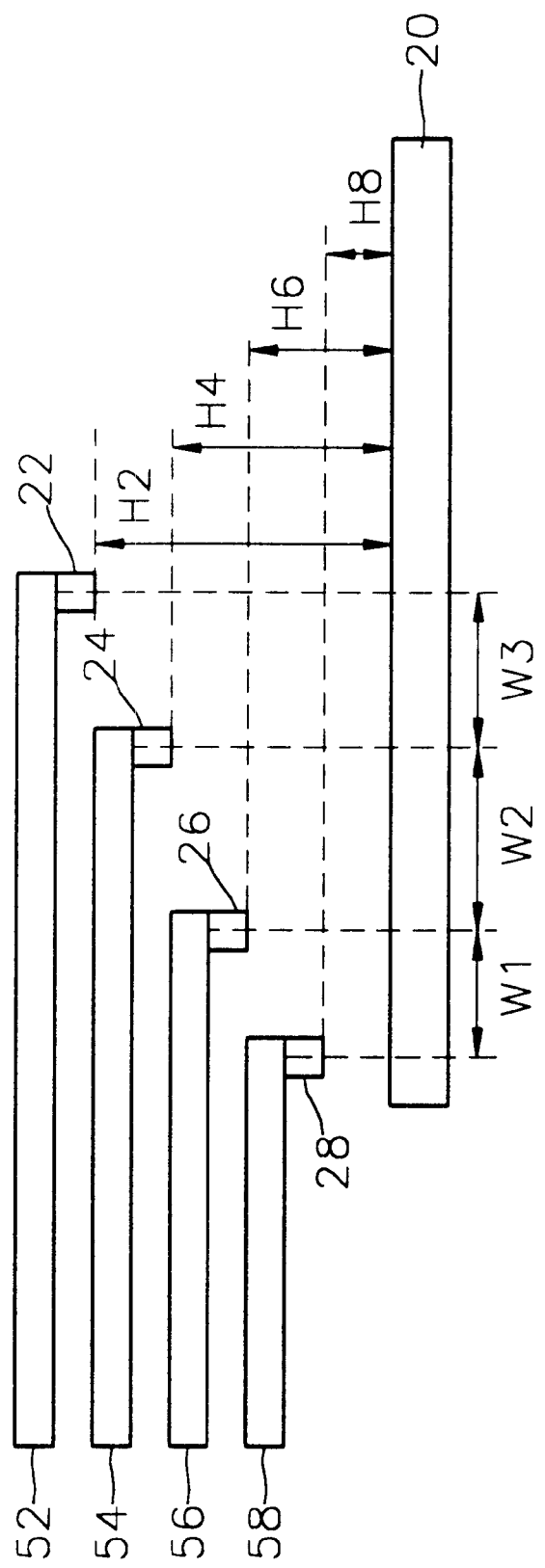
FIG. 5 schematically shows the positions of stream (straight)-type nozzles above the photomask in the photomask apparatus according to an embodiment of the present invention.

FIG. 4 is a plan view showing the positions of the chemical supply nozzles above the photomask 20 in the photomask apparatus according to an embodiment of the present invention. FIG. 5 schematically shows the positions of the stream-type chemical supply nozzles above the photomask in the photomask apparatus according to an embodiment of the present invention. It is noted from FIG. 4 that the chemical supply nozzles 22, 24, 26, and 28 are arranged in an almost a straight line in a diagonal direction. However, the horizontal or vertical positions of the chemical supply nozzles can vary as long as it is possible to improve the supply efficiency of the chemicals.

Referring to FIG. 5, which shows the positions of the chemical supply nozzles 22, 24, 26, and 28 above the photomask 20, the heights of the respective supply nozzles, that is, heights H2, H4, H6, and H8 from the surface of the photomask 20 to the nozzles and distances W1, W2, and W3 between the respective supply nozzles can vary. That is, the horizontal and vertical positions of the respective chemical supply nozzles can vary. In the present embodiment, four chemical supply nozzles are used. However, two or more chemical supply nozzles can be used.

The method for forming the pattern on the photomask performed by the developing apparatus according to the present invention will now be described. The exposing process is performed on the photomask 20 in which a chrome layer which is a light shielding layer and an E-beam resist layer which is a pattern forming material layer are formed on a transparent substrate by the exposing apparatus as designed. The photomask 20 on which the exposing process is performed is loaded on the fixed chuck 84. Part of the pattern forming material layer on which the exposing process was performed is developed and removed by rotating the rotation shaft 82 by the motor 80, thus rotating the photomask, and vertically and downwardly flowing the developing solution, whose temperature is independently controlled in each position, from the chemical supply nozzles 22, 24, 26, and 28 above the photomask. After measuring the CD in each position on the photomask 20 with respect to the pattern formed by removing part of the pattern forming material layer, it is possible to control the temperature and flux of the developing solution supplied from above the substrate to each position and the positions of the chemical supply nozzles, on the basis of the results of the measured CDs.

The photomask is manufactured by loading the photomask having a specific pattern on the fixed chuck in the processing chamber of the spin-type etching apparatus having a structure similar to that of the developing apparatus, which is installed to be connected to or separate from the developing apparatus of FIG. 3, rotating the photomask by a method similar to that used in the developing process, and vertically and downwardly flowing the etching solution whose temperature is independently controlled in each place from the plurality of positions above the photomask, thus etching and removing part of the chrome layer. At this time, it is possible to control the temperature and flux of the etching solution supplied from above the photomask to each position, the positions of etching solution supply nozzles, and etching time, on the basis of the results of the measured CDs.

In the present embodiment, various experiments for optimizing the processing conditions under which it is possible to minimize the deviation of the CD of the resist pattern are performed after performing the developing process under various processing conditions in manufacturing the photomask using the spinner apparatus according to the present invention.

Figure 6:
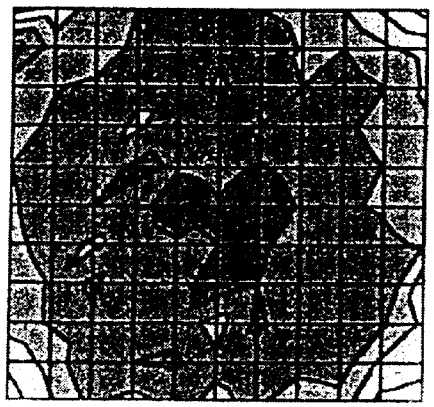
FIGS. 6 through 8 are images showing results of measuring the change of the critical dimension (CD) uniformity of the photomask, while varying the rotation speed of a spinner, according to an embodiment of the present invention.
Figure 7:
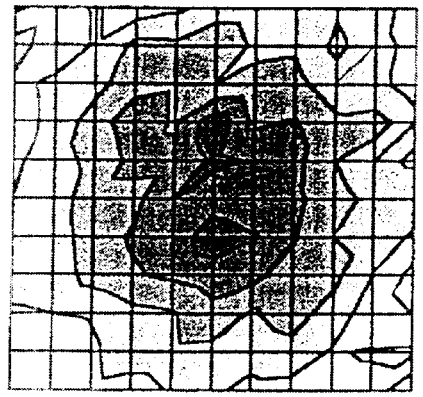
Figure 8:
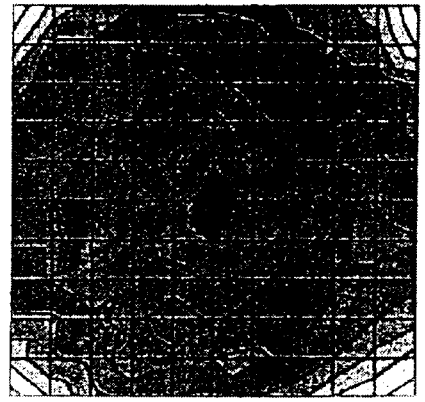

FIGS. 6 through 8 are images showing results of measuring changes in the critical dimension (CD) uniformity of the photomask, while varying the rotation speed of a spinner, according to an embodiment of the present invention. FIG. 6 shows the change in the CD uniformity of the photomask when the rotation speed of the spinner is 100 RPM. FIG. 7 shows the change in the CD uniformity of the photomask when the rotation speed of the spinner is 400 RPM. FIG. 8 shows the change in the CD uniformity of the photomask when the rotation speed of the spinner is 1,000 RPM. In the experiment, the developing process is performed using the two stream-type chemical supply nozzles according to the present invention. The measurement results are shown in Table 1. In the present experiment, other processing conditions excluding the rotation speed of the spinner are the same.

TABLE 1

| Classification | 100 RPM | 400 RPM | 1,000 RPM |
|---|---|---|---|
| 11 x 11 range | 28 nm | 34 nm | 42 nm |
| 9 x 11 range | 20 nm | 25 nm | 30 nm |

Referring to Table 1, the change in the CD uniformity of the photomask is measured with respect to the 11×11 range and the 9×11 range on the photomask. The range is the difference between the maximum CD value and the minimum CD value. The uniformity of the CD deteriorates as the rotation speed of the spinner increases. When the rotation speed of the spinner is equal to or less than 5 RPM, the spreading property of the chemicals deteriorates. Therefore, the most appropriate rotation speed of the spinner is between 5 and 100 RPM according to the present invention.

Figure 9:
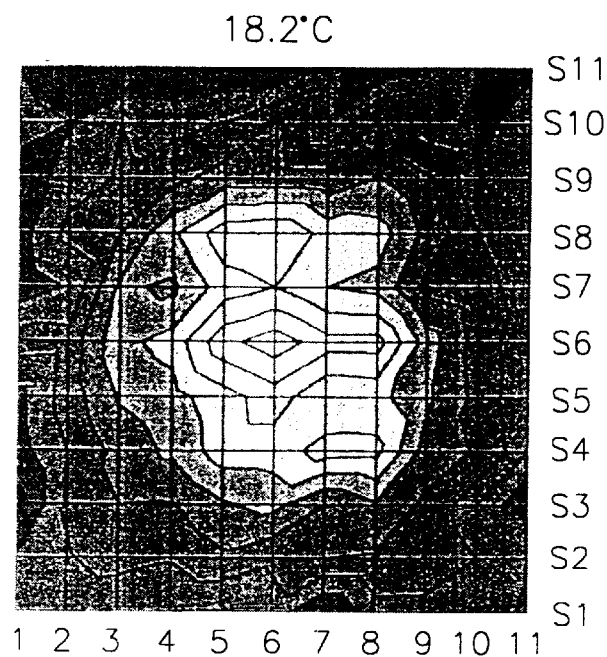
FIGS. 9 through 11 are images showing results of measuring the change of the CD uniformity of the photomask dependent on the change of the temperature of chemicals using one straight nozzle according to an embodiment of the present invention.
Figure 10:
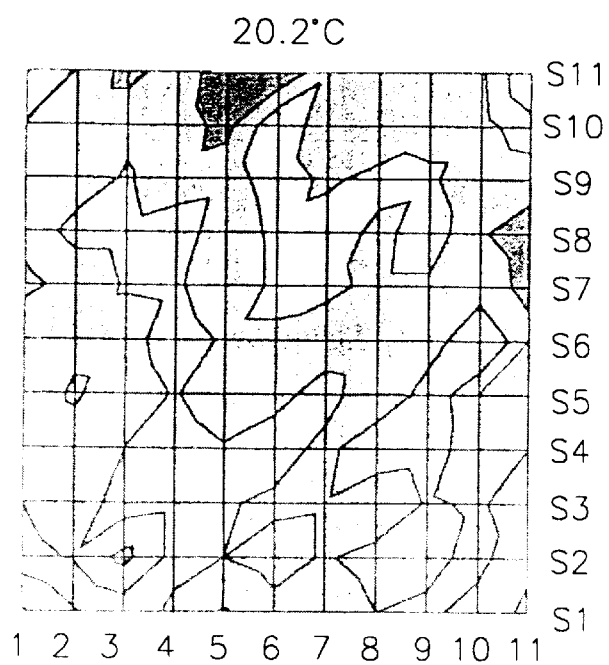
Figure 11:
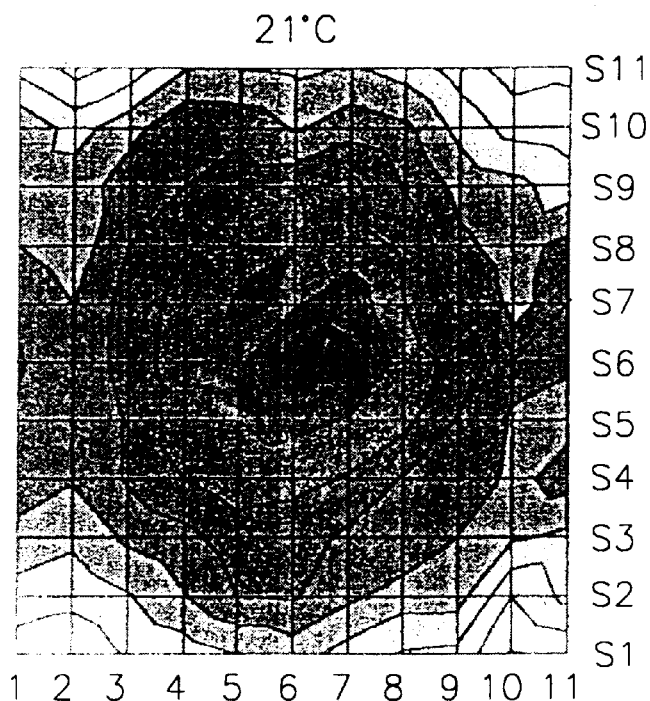

FIGS. 9 through 11 are iamges showing results of measuring the change in the CD uniformity of the photomask dependent on the change of the temperature of chemicals using one straight nozzle according to an embodiment of the present invention. FIGS. 9 through 11 show the change in the CD uniformity of the photomask when the temperatures of the chemicals are 18.2° C., 20.2° C., and 21° C. The measurement results are shown in Tables 2 and 3.

TABLE 2

Measurement results with respect to the 11 x 11 range

| Classification | 18.2° C. | 20.2° C. | 21.0° C. |
|---|---|---|---|
| Maximum CD | 3.124 μm | 3.159 μm | 3.267 μm |
| Minimum CD | 3.034 μm | 3.119 μm | 3.179 μm |
| Range | 90.0 nm | 40.0 nm | 88.0 nm |
| 3 Sigma (δ) | 59.0 nm | 20.2 nm | 53.9 nm |

TABLE 3

Measurement results with respect to the 9 x 9 range

| Classification | 18.2° C. | 20.2° C. | 21.0° C. |
|---|---|---|---|
| Maximum CD | 3.112 μm | 3.153 μm | 3.267 μm |
| Minimum CD | 3.034 μm | 3.131 μm | 3.19 μm |
| Range | 78.0 nm | 22.0 nm | 77.0 nm |
| 3 Sigma (δ) | 52.9 nm | 15.7 nm | 44.4 nm |

Referring to Tables 2 and 3, when the temperature of the chemicals varies under the same conditions, the ranges are 40.0 nm and 22.0 nm, respectively, and 3δ are 20.2 mn and 15.7 nm, respectively, which is the best result. It is noted that the deviation in the CD is significantly affected by the temperature of the chemicals and there exists an optimal temperature range.

Figure 12:
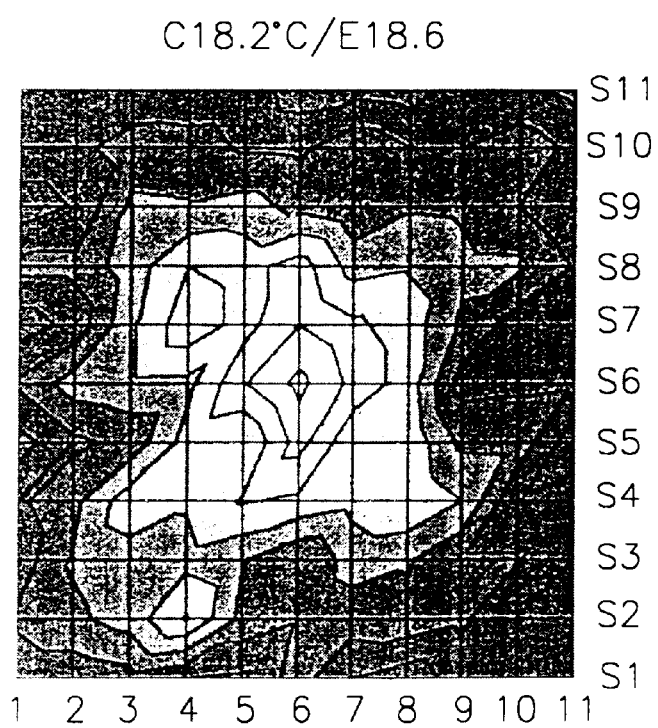
FIGS. 12 through 14 are images showing results of measuring the change of the CD uniformity of the photomask dependent on the change of the temperature of the chemicals using two straight nozzles according to an embodiment of the present invention.
Figure 13:
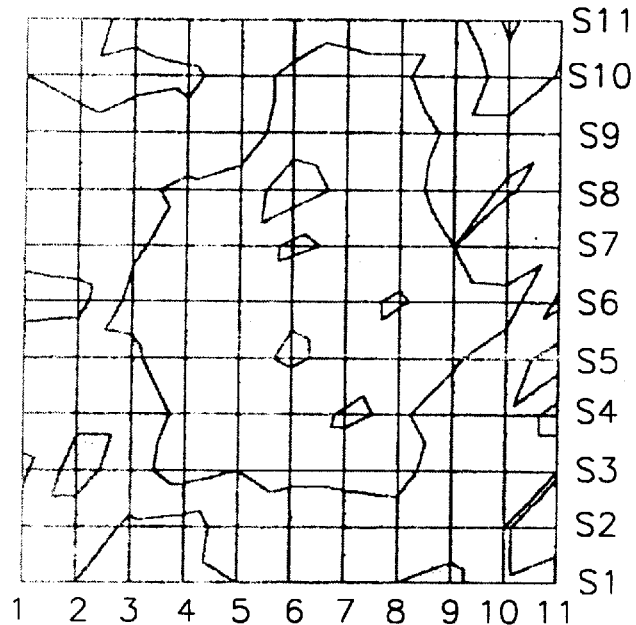
Figure 14:
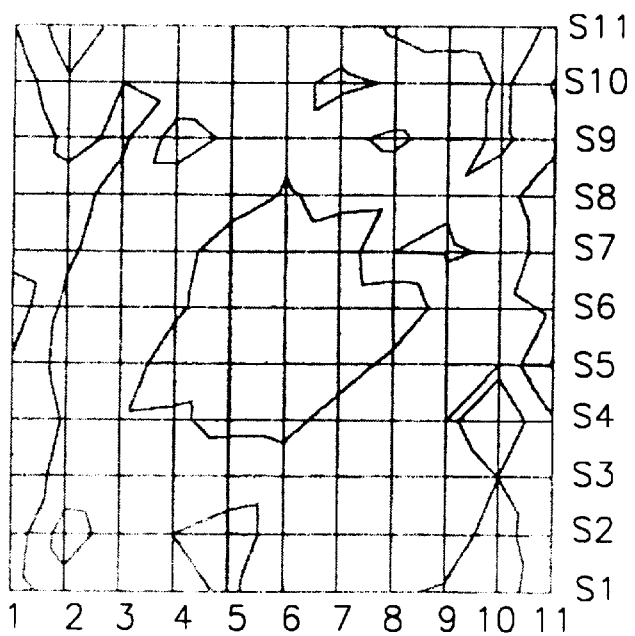

FIGS. 12 through 14 are images showing results of measuring the change in the CD uniformity of the photomask dependent on the change in the temperature of the chemicals using two straight nozzles according to an embodiment of the present invention. In FIG. 12, the temperature of the chemicals in the center is 18.2° C. and the temperature of the chemicals at the edge is 20.6° C. In FIG. 13, the temperature of the chemicals in the center is 20.2° C. and the temperature of the chemicals at the edge is 20.6° C. In FIG. 14, the temperature of the chemicals in the center and the temperature of the chemicals at the edge are 21° C. The respective measurement results are shown in Tables 4 and 5.

TABLE 4

Measurement results with respect to the 11 x 11 range

| Classification | 18.2° C./ 18.6° C. | 20.2° C./ 20.6° C. | 21.0° C./ 21.0° C. |
|---|---|---|---|
| Maximum CD | 3.107 μm | 3.159 μm | 3.276 μm |
| Minimum CD | 3.037 μm | 3.124 μm | 3.241 μm |
| Range | 70.0 nm | 35.0 nm | 35.0 nm |
| 3 Sigma (δ) | 44.9 nm | 19.3 nm | 20.9 nm |

TABLE 5

Measurement results with respect to the 9 x 9 range

| Classification | 18.2° C./ 18.6° C. | 20.2° C./ 20.6° C. | 21.0° C./ 21.0° C. |
|---|---|---|---|
| Maximum CD | 3.099 μm | 3.155 μm | 3.269 μm |
| Minimum CD | 3.037 μm | 3.124 μm | 3.241 μm |
| Range | 62.0 nm | 31.0 nm | 28.0 nm |
| 3 Sigma (δ) | 40.4 nm | 17.9 nm | 17.8 nm |

Referring to Tables 4 and 5, when the temperatures of the chemicals are different from each other in the two chemical supply nozzles under the same conditions, namely, when the temperatures of the chemicals supplied to the center of the photomask are equal to those of FIGS. 9 through 11, however, the temperatures of the chemicals supplied to the edge of the photomask are different from each other (FIGS. 12 and 13) or when the temperature of the chemicals supplied to the center of the photomask is equal to that of the chemicals supplied to the edge of the photomask (FIG. 14), the CD varies according to the minute change in the temperature.

Since the minute change in the temperature of the chemicals greatly affects the uniformity of the CD, it is very important to precisely control the temperature of the chemicals which are actually supplied to the resist surface of the photomask. In connection with the temperature of the chemicals, it is very important to manage the number and the positions of the chemical supply nozzles above the photomask, the distance between the supply nozzles, the fluxes of the chemicals supplied from the respective supply nozzles, and the developing time.

Figure 15:
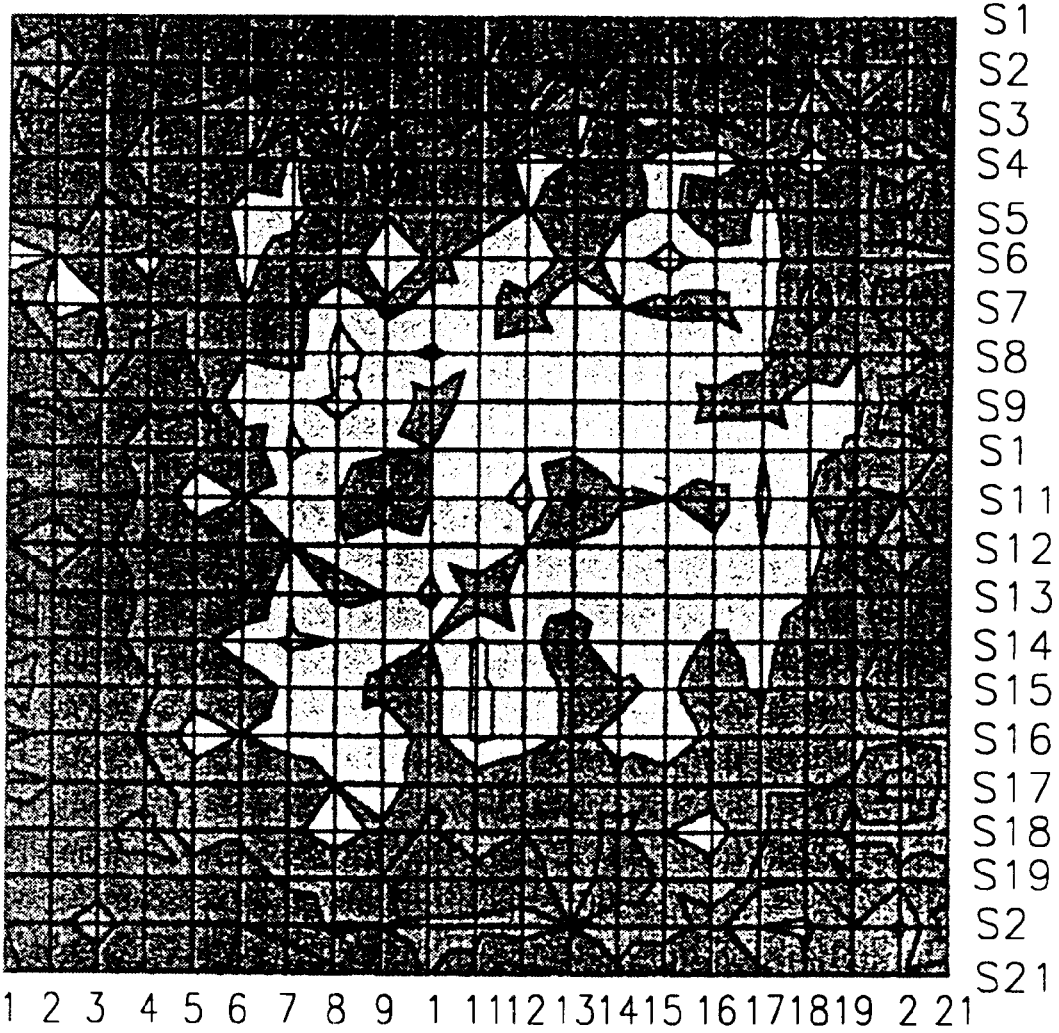
FIG. 15 is an image showing results of measuring the CD of the photomask using four straight nozzles according to an embodiment of the present invention.

FIG. 15 is an image showing the result of measuring the CD of the photomask using four straight nozzles according to an embodiment of the present invention. The temperature of the chemicals supplied through the first supply nozzle 22 is 20° C. and the flux of the chemicals supplied through the first supply nozzle 22 is 26 ml/30 sec. The temperature of the chemicals supplied through the second supply nozzle 24 is 20.1° C. and the flux of the chemicals supplied through the second supply nozzle 24 is 45 ml/30 sec. The temperature of the chemicals supplied through the third supply nozzle 26 is 20.3° C. and the flux of the chemicals supplied through the third supply nozzle 26 is 21 ml/30 sec. The temperature of the chemicals supplied through the fourth supply nozzle 28 is 20.1° C. and the flux of the chemicals supplied through the fourth supply nozzle 28 is 15 ml/30 sec. The developing time is two minutes. The etching time is 6.5 minutes.

It is noted from the results of FIG. 15 that the maximum CD is 2.179 μm, that the minimum CD is 2.158 μm, that the standard CD is 2.168 μm, that the range is 21 nm, and that 3δ is 13 nm. As a result of performing a reproducibility experiment under the same processing conditions, the range is 21 through 26 nm and 3δ is 11 through 15 nm with respect to a 21×21 region on a 5 inch×5 inch mask, which is very excellent CD uniformity.

Such a degree of CD uniformity can be applied to mass production of devices of 0.15 μm, and devices of 0.13 μm and 0.10 μm which will be developed later as well as devices of 0.18 μm.

The above embodiments were described centering around the processes of manufacturing the photomask. However, the same principle can be applied to the processes of manufacturing a semiconductor device on a semiconductor wafer. Not only the photomask but also the strong substrates such as a liquid crystal display (LCD) substrate, a flat panel display (FPD) substrate, and a semiconductor wafer can be used as the substrate to which the present invention can be applied. The principle of the present invention can be applied to the etching process of the resist as well as the developing process of the resist.

As described above, according to the present invention, it is possible to realize optimal processing conditions where the uniformity of the CD is minimized by installing a plurality of chemical supply nozzles above the substrate on which the processes will be performed and independently controlling the temperature and flux of the chemicals with respect to each supply nozzle. Therefore, it is possible to flexibly cope with the tendency where semiconductor devices are highly integrated and masks or semiconductor wafers become larger.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a pattern, comprising:

sequentially forming an etched material layer to be etched and a pattern forming material layer on a substrate;

performing an exposing process to define a pattern on the pattern forming material layer;

loading the substrate on a rotating member in a processing chamber in which a processing temperature is controlled;

providing a plurality of supply nozzles at a plurality of positions above the substrate, said supply nozzles providing a developing solution, the temperature of the developing solution of each of the plurality of supply nozzles being independently controlled;

developing and removing part of the pattern forming material layer on which the exposing process is performed by rotating the substrate and vertically and downwardly flowing the developing solution from the plurality of supply nozzles above the substrate;

measuring a critical dimension (CD) in each of a plurality of positions on the substrate with respect to the pattern formed by removing part of the pattern forming material layer; and controlling the temperature of the developing solution supplied from each position above the substrate on the basis of the result of the measured CDs.

2. The method of claim 1, wherein the flux of the developing solution supplied to the substrate from each nozzle is independently controlled.

3. The method of claim 1, wherein the pattern is formed on a photomask formed of a light shielding layer as the etched material layer and an E-beam resist layer as the pattern forming material layer on a transparent substrate.

4. The method of claim 1, further comprising:

loading the substrate in which part of the pattern forming material layer is removed on the rotating member in the processing chamber; and etching and removing part of the etched material layer by rotating the substrate and vertically and downwardly flowing an etching solution from the plurality of nozzles, the temperature of the etching solution from each nozzle being independently controlled.

5. A method for performing etching, comprising:

forming an etching mask layer having a specific pattern on a substrate on which an etched material layer is formed;

loading the substrate on which the etching mask layer is formed on a rotating member in a processing chamber in which a processing temperature is controlled;

etching and removing part of the etched material layer by rotating the substrate and vertically and downwardly flowing an etching solution from a plurality of supply nozzles above the substrate, the temperature of the etching solution from each nozzle being independently controlled;

measuring a critical dimension (CD) at each of a plurality of positions on the substrate with respect to the pattern of the etched material layer; and controlling the temperature of the etching solution supplied from above the substrate to each position on the basis of the result of the measured CD.

6. The method of claim 5, wherein the flux of the etching solution supplied to the substrate from each nozzle is independently controlled.

7. The method of claim 5, wherein the position of the plurality of supply nozzles is variable horizontally and vertically with respect to the substrate.

8. The method of claim 5, wherein the substrate is one selected from the group consisting of a semiconductor wafer, an LCD substrate, and an FPD substrate.

* * * * *